United States Patent
Kobayashi et al.

(10) Patent No.: US 7,251,741 B2
(45) Date of Patent: Jul. 31, 2007

(54) METHOD OF CONTROLLING SIGNAL GENERATOR

(75) Inventors: Takuma Kobayashi, Kanagawa (JP); Nobuyoshi Takehara, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 376 days.

(21) Appl. No.: 10/727,527

(22) Filed: Dec. 5, 2003

(65) Prior Publication Data

US 2004/0117676 A1 Jun. 17, 2004

(30) Foreign Application Priority Data

Dec. 11, 2002 (JP) ............................. 2002-359126
Nov. 21, 2003 (JP) ............................. 2003-392028

(51) Int. Cl.
*G06F 1/04* (2006.01)
(52) U.S. Cl. ...................................... 713/502; 713/300
(58) Field of Classification Search ................ 713/300, 713/340, 500, 502
See application file for complete search history.

(56) References Cited

U.S. PATENT DOCUMENTS

| | | | |
|---|---|---|---|
| 4,562,524 A * | 12/1985 | Mutoh et al. ................. 363/41 |
| 5,621,300 A | 4/1997 | Sato et al. ..................... 320/5 |
| 5,714,869 A | 2/1998 | Tamechika et al. ........... 320/30 |
| 5,834,911 A * | 11/1998 | Kimura ....................... 318/254 |
| 5,869,956 A * | 2/1999 | Nagao et al. ................ 323/299 |
| 5,892,354 A | 4/1999 | Nagao et al. ................ 323/299 |
| 6,493,246 B2 | 12/2002 | Suzui et al. ................... 363/95 |
| 6,611,441 B2 | 8/2003 | Kurokami et al. ........ 363/56.02 |
| 2002/0105765 A1 | 8/2002 | Kondo et al. ................. 361/42 |
| 2003/0067723 A1 | 4/2003 | Suzui et al. ................... 361/42 |
| 2003/0218888 A1 | 11/2003 | Suzui et al. ................... 363/34 |
| 2004/0027112 A1 | 2/2004 | Kondo et al. ................ 323/355 |

* cited by examiner

*Primary Examiner*—Dennis M. Butler
(74) *Attorney, Agent, or Firm*—Fitzpatrick, Cella, Harper & Scinto (57) ABSTRACT

A method of controlling a semiconductor device using a microcomputer having a timer is provided. An interrupting step interrupts the semiconductor device using the timer, by generating a control signal for controlling a timing of turning on/off the semiconductor device. The interrupting step is performed in accordance with an interrupting signal which is input to the microcomputer at every occurrence of a predetermined period. The interrupting step comprises a setting step of giving a set value to the timer and a calculating step of determining a set value for a subsequent interrupting step, such that the set value determined in the calculating step is given to the timer in the setting step of the subsequent interrupting step. Therefore, a longer time can be allowed for determining a set value for the timer, and the processing speed required for the microcomputer can be reduced.

9 Claims, 9 Drawing Sheets

| TIMER REGISTER \ I/O TERMINAL | S1 TERMINAL | S2 TERMINAL |
|---|---|---|
| TIMR1 | HIGH | — |
| TIMR2 | LOW | — |
| TIMR3 | — | HIGH |
| TIMR4 | — | LOW |

|  | SET VALUE IN PREVIOUS INTERRUPT PERIOD | CURRENT SET VALUE |
|---|---|---|
| TIMR1 | 350 | 200 |
| TIMR2 | 500 | 500 |
| TIMR3 | 850 | 700 |
| TIMR4 | 1000 | 1000 |
| SET DUTY | 30% | 60% |

METHOD OF CONTROLLING SIGNAL GENERATOR

BACKGROUND OF THE INVENTION

1. Field of the Invention

The present invention relates to a method of controlling a signal generator that uses a microcomputer having a timer and turns on/off a semiconductor device by means of the timer.

2. Related Background Art

There have hitherto been known various signal generators for switching semiconductor devices.

Particularly, microcomputers having timers are capable of switching semiconductor devices at higher frequency than the operating frequencies of the microcomputers because the timers operate in parallel with the programs of the microcomputers and signals are outputted from I/O ports.

Such microcomputers having timers are used to control various semiconductor switches. Typically, such a microcomputer controls the semiconductor main SW circuit of a power converter or a semiconductor circuit in a motor drive for a camera or a VTR.

As a representative example of controlling the turning on/off of a semiconductor device by means of the microcomputer, the following will describe a power converter for photovoltaic power generation and a method of controlling the same.

Figure 2:
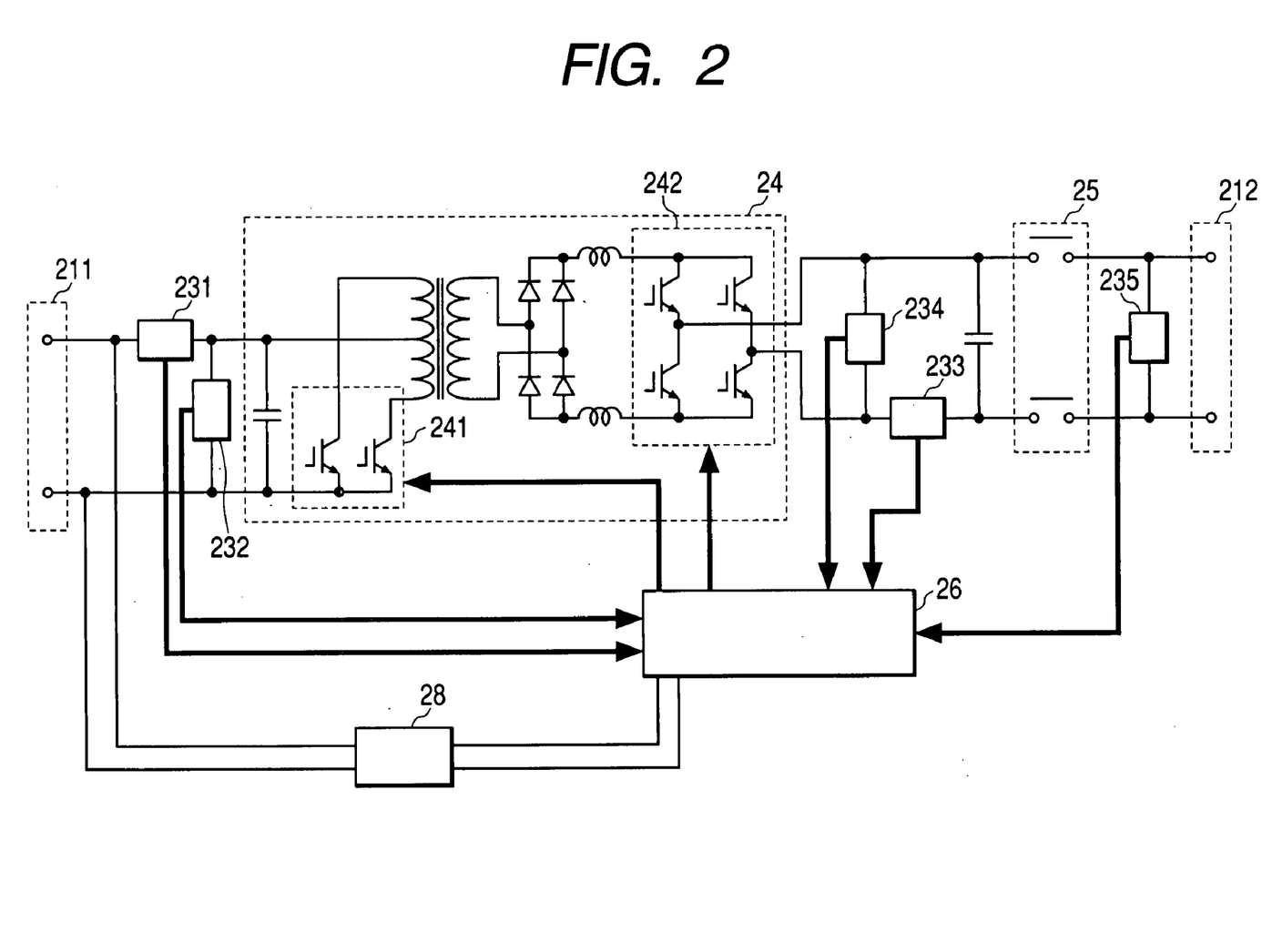
FIG. 2 is a block circuit diagram showing a power converter for photovoltaic power generation.

FIG. 2 is a block circuit diagram showing the power converter for photovoltaic power generation. Direct-current power from a solar battery connected to an input terminal is converted to alternating current power by a DC/AC converter circuit which is constituted of a push-pull section 241, an inverting section 242 and so on, and the converted power is outputted from an output terminal. In the push-pull section, two switching elements are subjected to PWM control, direct-current power is subjected to DC/AC conversion, and a voltage is increased by a transformer. Thereafter, passage is made through a diode bridge and an inductance, so that a sinusoidal waveform is generated with full-wave rectification.

Figure 13:
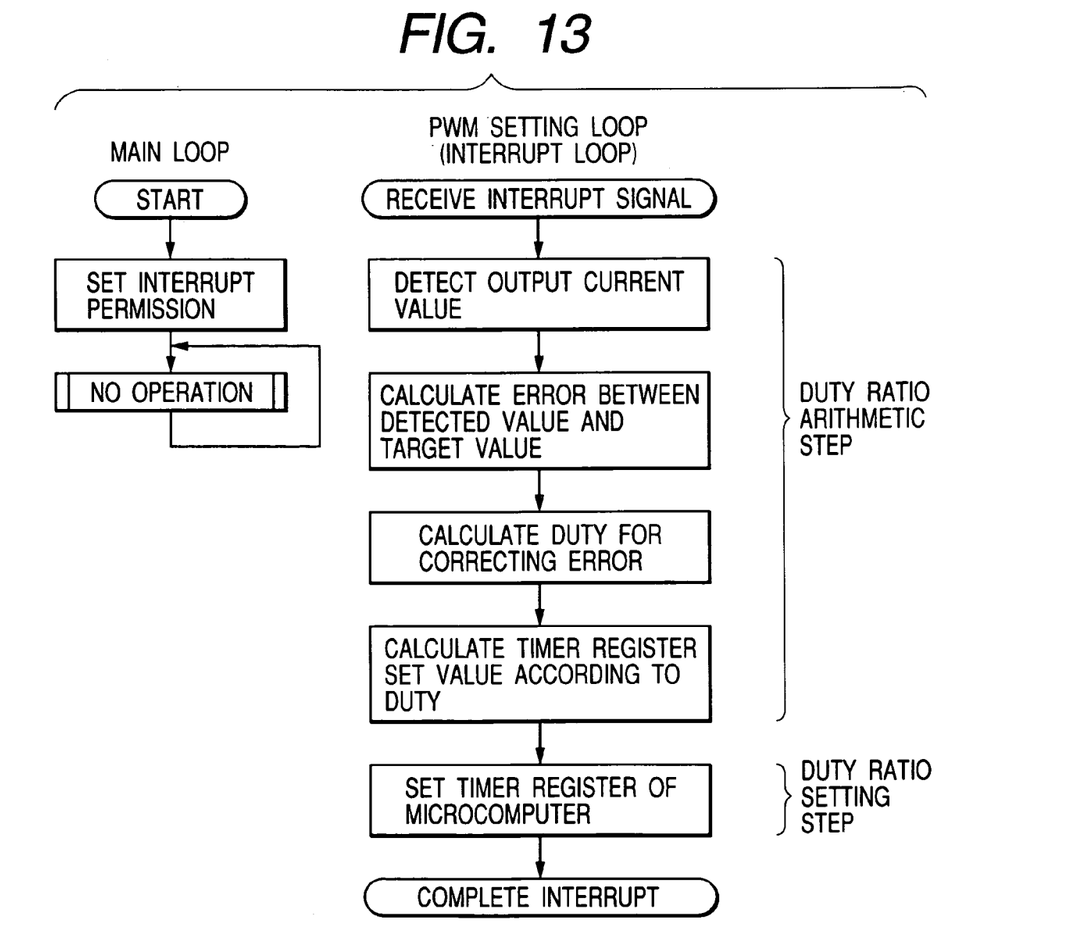
FIG. 13 is an explanatory flowchart showing an example of a conventional method of controlling a power converter.

The following will describe a method of generating a driving signal of a switching element in the push-pull section. A reference sinusoidal waveform pattern having been recorded in a ROM beforehand is multiplied by a current command value commanded by MPPT (maximum power point tracking) of the solar battery, so that an instantaneous current command value is generated. Then, the instantaneous current command value generated thus is compared with an instantaneous current detection value, which is generated by converting the output of an output current detector to digital data by means of an AD converter in a microcomputer. Then, a Duty value (a ratio of an ON period to a switching period) for correcting an error is calculated. A timer set value is calculated according to the calculated Duty value and the timer set value is stored in a register for a timer, so that the timing of turning on/off the switching element is controlled. In this case, a control flowchart shown in FIG. 13 is obtained. The following will specifically describe switching control using the microcomputer having the timer that realizes the control flow of FIG. 13.

In the control of the switching element, a single (increment) timer in the microcomputer, four registers in the microcomputer and two I/O ports are used. In the microcomputer used in this control, when the timer counter value of the timer agrees with (compare match) a value set in the register, the output of the I/O terminal becomes High or Low, so that the turning on/off of the switching element is controlled.

For more details, specific numeric values are substituted in the following explanation. For example, it is presumed that a microcomputer having an operating frequency of 20 MHz is used, a switching frequency is 20 kHz, and a Duty set value obtained by operations is 50%.

Figure 3:
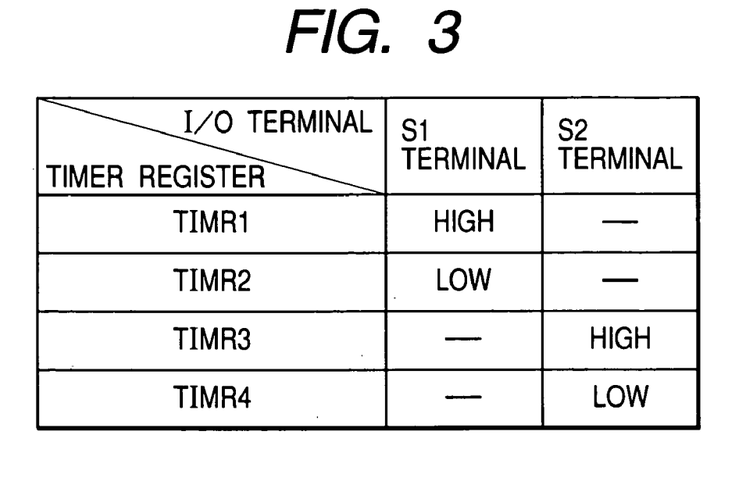
FIG. 3 is a relationship diagram showing the output states of timer registers and I/O terminals in the microcomputer.
Figure 4:
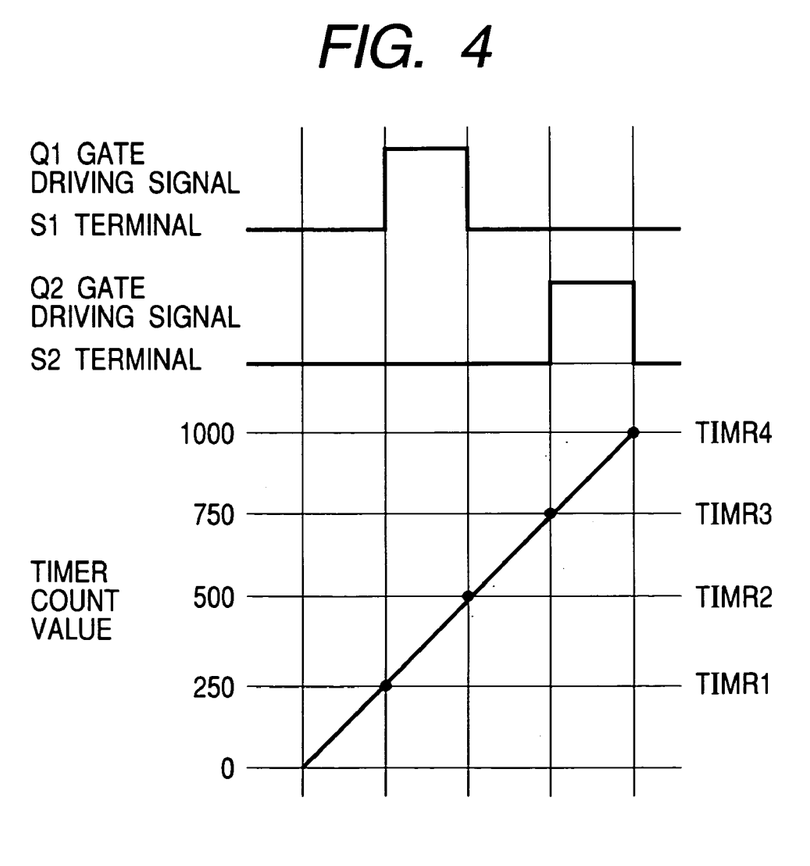
FIG. 4 is a diagram showing timer counter values, timer register values, and the outputs of the I/O terminals in the microcomputer.

When the values of timer registers TIMR 1 to 4 and the value of the timer counter agree with one another, the I/O terminals have output states shown in FIG. 3. In such a setting, in order to set the Duty set value at 50%, the timer registers need to be set so that TIMR1=250, TIMR2=500, TIMR3=750 and TIMR4=1000 are obtained. In this case, a relationship between the values of the timer counters and the outputs of the I/O terminals is obtained as FIG. 4. When the value of the timer counter agrees with 250 that is the set value of the TIMR1, a High signal is outputted from an S1 terminal. When the value of the timer counter agrees with 500 that is the set value of TIMR2, a Low signal is outputted from the S1 terminal. When the value of the timer counter agrees with 750 that is the set value of TIMR3, a High signal is outputted from an S2 terminal. When the value of the timer counter agrees with 1000 which is the set value of TIMR4, a Low signal is outputted from the S2 terminal. A timer counter is reset at 0 at the same time and counting is restarted from 0. Actually the set values of the timer registers are changed repeatedly every time a duty ratio is calculated. Control is performed so that a sinusoidal wave with full-wave rectification is outputted to the input of the inverting section 242 by resetting a duty ratio.

Namely, a period during which the value of the timer counter is counted from 0 to TIMR4 (fixed at 1000 in the present example) is referred to as a switching period. During this period, processing in the PWM setting loop of FIG. 13 is performed. For example, when a switching frequency is 20 kHz, the loop is performed 20000 times per second. In many cases, a switching frequency of a power converter for photovoltaic power generation is set around 20 to 40 kHz in consideration that the maximum frequency of an audio frequency is 16 kHz.

In recent years, a power converter-integrated solar cell module has been developed in which power converters of equal capacities (about 100 W) are mounted on the back of a single solar cell module. The power converters used in the module are integrally mounted on the solar cell module. It is desirable that such power converters be small in size (100 to 300 cc). Hence, a switching operation is performed faster in the power converter and the internal components (high-frequency transformer, coil, capacitor) of the power converter are miniaturized.

Further, as a power converter for similarly outputting a sinusoidal waveform, power converters for driving motors are known in general.

Figure 5:
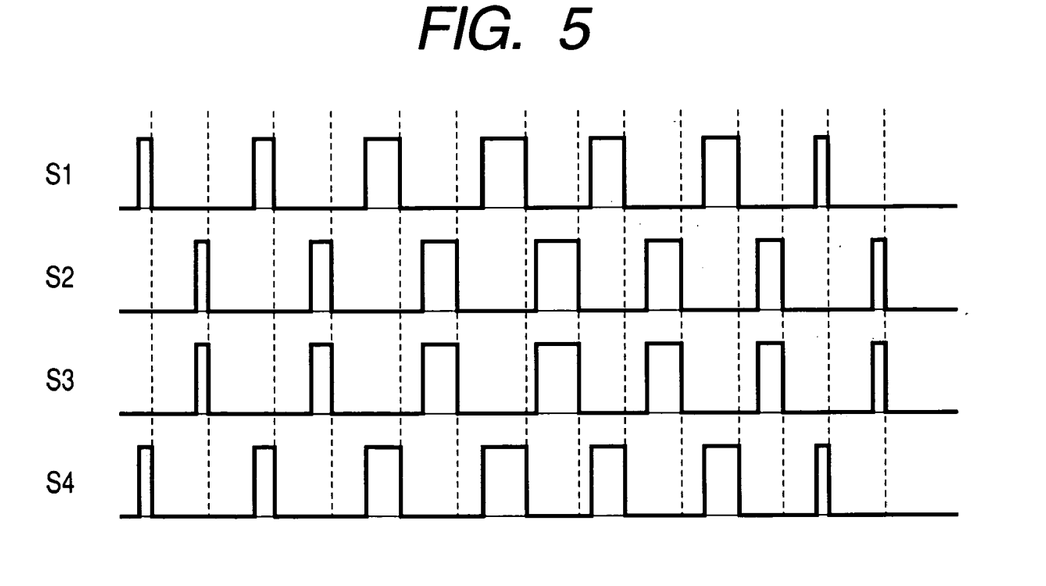
FIG. 5 is a PWM signal for driving a switching element for driving a motor.
Figure 6:
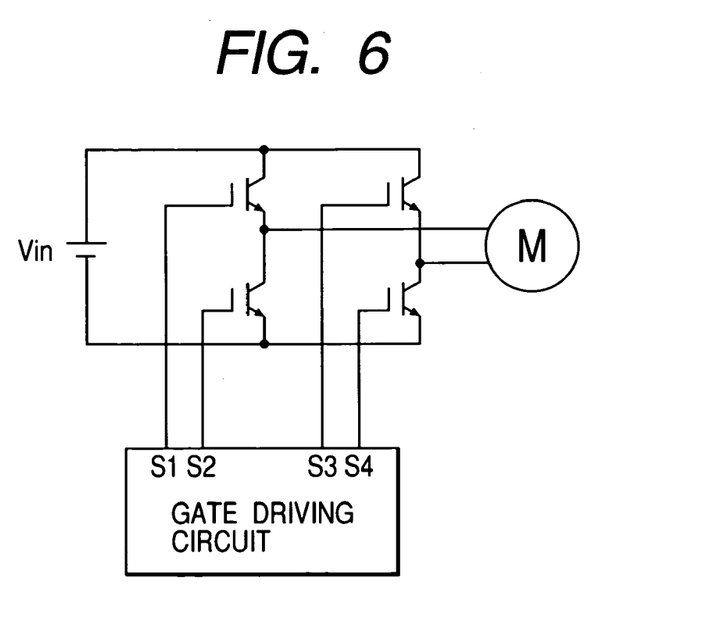
FIG. 6 is a simple block diagram for driving the motor.

In the power converter for driving a motor, the amplitude of a sinusoidal waveform is stored beforehand in a semiconductor memory as a digital value of about 8 to 16 bits, the value is converted to PWM control signals shown in FIG. 5, and the signals are outputted, so that switching elements (FIG. 6) arranged in a full bridge configuration are controlled and a sinusoidal waveform is outputted.

However, the conventional controlling method causes the following problem: in the power converter for photovoltaic power generation, feedback control using an output current value is performed as shown in FIG. 13 and thus an arithmetic quantity is increased in the microcomputer. At this point in time, since it takes a long time to calculate a duty ratio and set the timer register, a period generating no signal is more likely to appear in some relationships between the set value of the timer register and the count value of the timer count.

Figure 7:
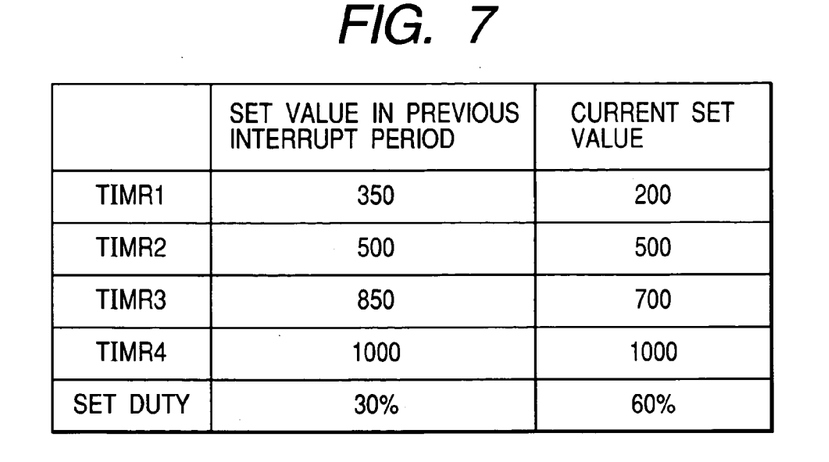
FIG. 7 is a diagram showing set values of each timer register.
Figure 8:
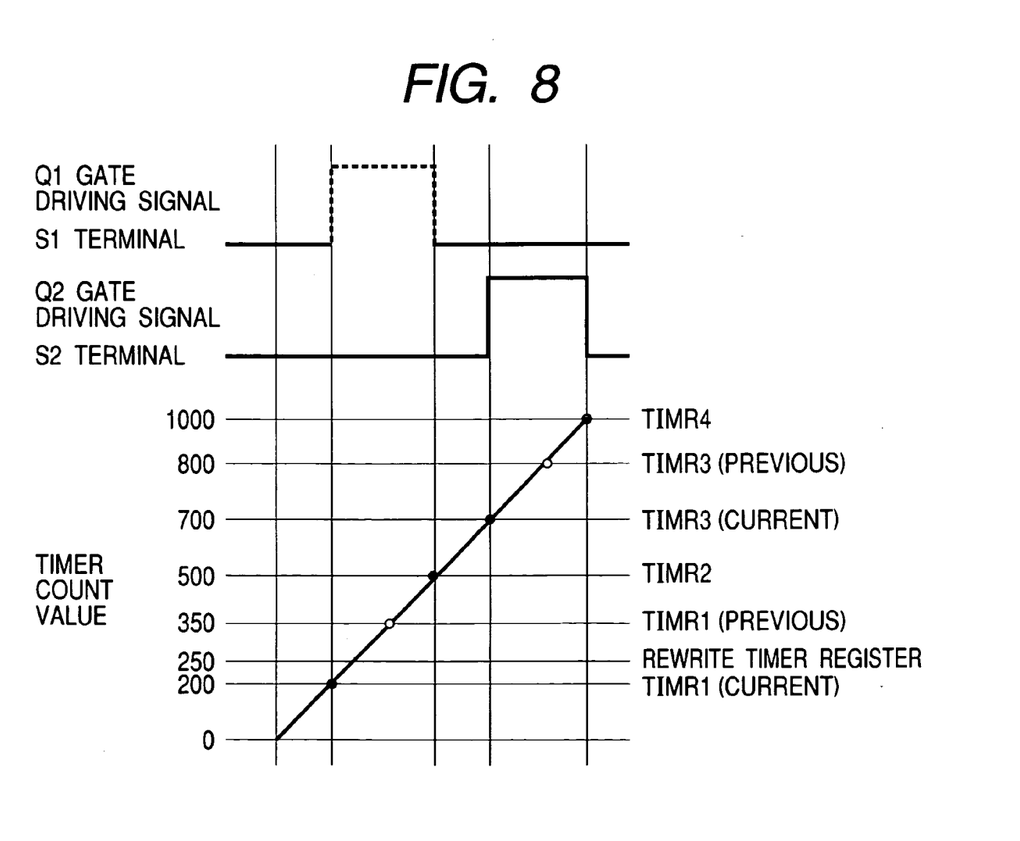
FIG. 8 is a diagram showing timer counter values, timer register values, and the outputs of the I/O terminals in the microcomputer in the event of a waveform dropout.

The following explanation will be made with specific numeric values. It is assumed that in the step of calculating a duty ratio and the step of setting a timer register value in an interrupting step before a predetermined period, TIMR1=350, TIMR2=500, TIMR3=850, and TIMR4=1000 set for the four time registers as shown in FIG. 7. Currently setting is made so that when the timer counter has a value of 350, the S1 terminal is placed in a High state, when the timer counter has a value of 500, the S1 terminal is placed in a Low state, when the timer counter has a value of 850, the S2 terminal is placed in the High state, when the timer counter has a value of 1000, the S1 terminal is placed in the Low state. It is assumed that when the current output current value is detected and a duty ratio is calculated, timer register values set in the step of setting timer register values are calculated so as to have TIMR1=200, TIMR2=500, TIMR3=700, and TIMR4=1000 as shown in FIG. 7. At this point in time, since it takes a long time to calculate a duty ratio, the timer counter has already exceeded the value of the timer register TIMR1. In this case, the signal of the I/O terminal remains in the Low state. For example, when the calculation of a duty ratio is completed by the timer counter, in the case where the count value is already 250, High output is not made from the S1 terminal. Namely, when 200 serving as the current set value is written at the time of changing the set value of TIMR1, the timer counter already exceeds 200, which is the set value of TIMR1, and thus a High signal is not outputted from the S1 terminal as shown in FIG. 8. The set value of TIMR3 is also changed from 850 to 700 immediately after the set value of TIMR1 is changed. In this case, since the timer counter has not reached the set value of TIMR3, a High signal is normally outputted from the S2 terminal. As a result, since the High signal is not outputted from the S1 terminal, a switching element Q1 is not driven and only one side of the push-pull section is turned on.

Such a signal waveform dropout may generate noise from a transformer connected to the subsequent stage of the switching element or may cause a time period when voltage is applied only to one side of the transformer. Hence, the transformer may have biased magnetization and may not function as a power conditioner. Particularly, since a waveform dropout frequently occurs when a duty ratio increases, biased magnetization arises a serious problem.

In order to solve the problem, a microcomputer with a high computing speed may be used to perform a Duty operation and a Duty setting before a waveform is generated. However, the microcomputer has to have high processing speed.

Since the high-speed microcomputer is expensive with a high power consumption, a power converter has low efficiency, a higher temperature, and a large peripheral circuit. Particularly when power converters are manufactured with small sizes and capacities, disadvantageous conditions are imposed.

Further, a method of limiting the maximum duty ratio so as to secure a calculating/setting time is available. In this method, the ON period of the switching element is shortened and thus a power cannot be fed sufficiently to the output side.

Furthermore, in the power converter having a transformer, an ON time (duty ratio) has to be equal at the switching of Q1 and Q2. If two switching elements are different in ON time, positive and negative voltages applied to the transformer disagree with each other. This state is the same as the application of direct-current voltage to the transformer. The transformer has biased magnetization as in the case of a waveform dropout and may not normally operate as a power conditioner.

SUMMARY OF THE INVENTION

The present invention has been devised in view of the above-described problems and it is, therefore, an object of the present invention to provide a signal generator that uses a small and inexpensive microcomputer having a low operating frequency and can perform high-frequency switching on a semiconductor device without reducing efficiency and a method of controlling a power converter using the signal generator.

The present invention devised above includes the following various aspects.

Aspect 1

A method of-controlling a signal generator using a microcomputer having a timer, the signal generator outputting a control signal for controlling a timing of turning on/off a semiconductor device by means of the timer,
  the method comprising an interrupting step started by an interrupting signal to the microcomputer every predetermined period,
  wherein the interrupting step comprises at least the setting step of setting a set value for the timer, the set value being calculated in a pre-interrupting step preceding the interrupting step, and the calculating step of determining a set value for the timer, the set value being used in a post-interrupting step succeeding the interrupting step, and the setting step is performed before the calculating step in each of the interrupting steps.

Aspect 2

The method of controlling the signal generator according to aspect 1, wherein the interrupting step comprises the setting step of setting a first timing of turning on/off the semiconductor device for the timer, the first timing being calculated in the calculating step of a pre-interrupting step preceding the interrupting step by the predetermined period, and the calculating step of calculating a second timing of turning on/off the semiconductor device, the second timing being set for the timer in the setting step of a post-interrupting step succeeding the interrupting step by the predetermined period.

Aspect 3

A method of controlling a signal generator using a microcomputer having a timer, the signal generator outputting a control signal for controlling a timing of turning on/off at least first and second semiconductor devices by means of the timer,
  the method comprising an interrupting step started by an interrupting signal to the microcomputer every predetermined period,
  wherein the interrupting step comprises the calculating step of calculating a timing of turning on/off the first and the second semiconductor devices, and the setting step of setting, for the timer, the calculated timing of turning on/off the first and the second semiconductor devices after an on/off control signal of the first semiconductor device is outputted.

Aspect 4

The method of controlling the signal generator according to any one of aspects 1 to 3, wherein the signal generator controls the semiconductor device of a power converter.

Aspect 5

The method of controlling the signal generator according to aspect 4, wherein the power converter controlled by the signal generator is a power conditioner for photovoltaic power generation.

Aspect 6

A program for performing the method of controlling the signal generator according to any one of aspects 1 to 5.

Aspect 7

A recording medium which stores the program of aspect 6.

DESCRIPTION OF THE PREFERRED EMBODIMENTS

Embodiments of the present invention will be described below in accordance with the accompanying drawings.

Embodiment 1

(Internal Structure of Power Converter)

FIG. 2 shows the structure of a power converter using a signal generator of the present invention. Reference numeral 211 denotes an input terminal for inputting a direct-current power from a solar cell and reference numeral 212 denotes an output terminal for outputting a power having been converted to alternating current power to a system and an alternating load. Reference numeral 24 denotes a DC/AC converter circuit constituted of a smoothing capacitor, a reactor, a switching element and so on. Reference numeral 25 denotes an interconnection relay for opening and closing an alternating output, reference numeral 232 denotes an input voltage detector for detecting voltage inputted from the input terminal, reference numeral 231 denotes an input current detector for detecting inputted current, reference numeral 234 denotes an output voltage detector for detecting voltage which is subjected to DC/AC conversion by the DC/AC converter circuit and is outputted, reference numeral 233 denotes an output current detector for detecting outputted current, and reference numeral 235 denotes a system voltage detector for detecting voltage inputted from the output terminal. Reference numeral 26 denotes a control circuit constituted of a microprocessor and so on.

In the control circuit 26, according to a value detected by the direct-current voltage detector 232 and the direct current detector 231, control is performed to retrieve the maximum power from a solar cell array (maximum power tracking control) and various kinds of control and protection are performed on a push-pull control part and an inverted part. These kinds of control are mainly performed by a one-chip microcomputer in which the functions of an I/O port, an AD converter, a timer, a memory and so on are provided on one chip. Further, a control source for operating the control circuit is supplied by a converting power inputted from the input terminal to a predetermined voltage by means of a control source generating circuit 28.

(Control Circuit)

As the control circuit 26 serving as one embodiment of a device using the method of controlling the signal generator according to the present invention, a one-chip microcomputer is available. The microcomputer has the functions of a CPU, a memory, an AD converter, a 16-bit timer, an I/O port and so on that are provided on one chip. By connecting an external component such as a quartz oscillator and a capacitor to the microcomputer, various kinds of control can be performed to control the power converter. Although the present embodiment uses the microcomputer formed in one chip including a timer function, an IC for a timer may be provided on another chip as long as the timer can be controlled by the microcomputer. The term "A microcomputer having a timer" used in the claims includes the case where the microcomputer and the IC for the timer are provided on different chips.

(Controlling Method)

The power converter for photovoltaic power generation performs various kinds of control. The following will discuss the generation of a sinusoidal waveform. A sinusoidal waveform is outputted by performing PWM control on the switching element (semiconductor device) of a push-pull section, increasing a voltage by means of the transformer, generating a sinusoidal wave with full-wave rectification through a diode and an inductance, and inverting (steering) the sinusoidal wave by means of the switching element of an inverting section.

Figure 1:
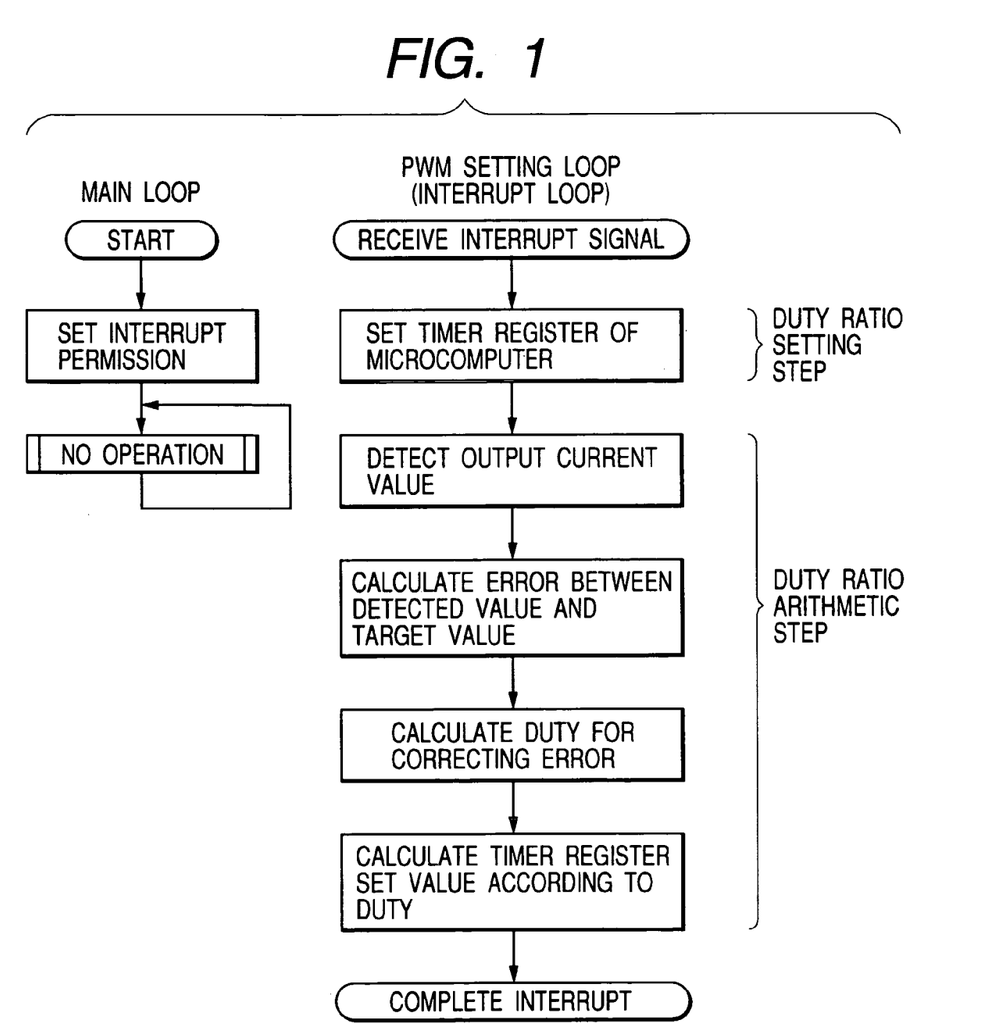
FIG. 1 is an explanatory flowchart showing a method of controlling a power converter described in Embodiment 1 of the present invention.

The PWM control for a sinusoidal wave is performed in the push-pull section according to the flow of FIG. 1.

When an interrupting signal is inputted to the microcomputer, writing on the timer register for controlling the push-pull section is started first. That is, when the microcomputer receives an interrupting signal, a duty value predetermined in the timer register is set immediately. The duty set at this time is a duty value calculated in an interrupting step before a predetermined period. As an exception, a predetermined initial duty value is set for the timer register only at the first setting of a duty. The initial value can be set arbitrarily as long as the value is not too large (a large value may cause overcurrent upon switching). In many cases, 0 does not cause any problems. With an operation using a controlling method described later, a proper duty value is automatically calculated after several loop operations.

Then, an instantaneous current detection value is read, which has been converted into digital data by an AD converter in the microcomputer. The value is compared with an instantaneous current command value that is obtained by multiplying a reference sinusoidal waveform pattern having been recorded in a ROM beforehand by a current command value having been commanded by the MPPT (maximum power point tracking) of a solar cell.

Subsequently, Duty for correcting an error at that time is calculated and a set value for the timer register-is calculated according to the calculated duty. Thus, a series of interrupting steps is completed. The arithmetic result is recorded in a predetermined memory and is written on the timer register in the first setting step of the subsequent interrupting step.

The following explanation will be made with specific numeric values. When a one-chip microcomputer having an operating frequency of 28 MHz is used, one clock has 36 nS. Thus, when the switching frequency of the push-pull section is set at 100 kHz, one switching period has 280 clocks and thus one switching element has 140 clocks equivalent to a half switching period. Further, when the maximum set duty ratio is 90%, the switching element has the maximum ON period of 126 clocks. When these numeric values are actually set for the timer registers, TIMR1=14, TIMR2=140, TIMR3=254, and TIMR4=280 are obtained.

At this point in time, about 200 clocks are provided from the detection of current to the calculation of a timer set value and about 10 clocks are provided for the writing of the set value in the timer register.

Since the writing of the set value in the timer register has 10 clocks, the value of the timer register is rewritten before reaching the minimum set timer register value (TIMR1=14), thereby preventing waveform dropout occurred in the prior art.

Figure 9:
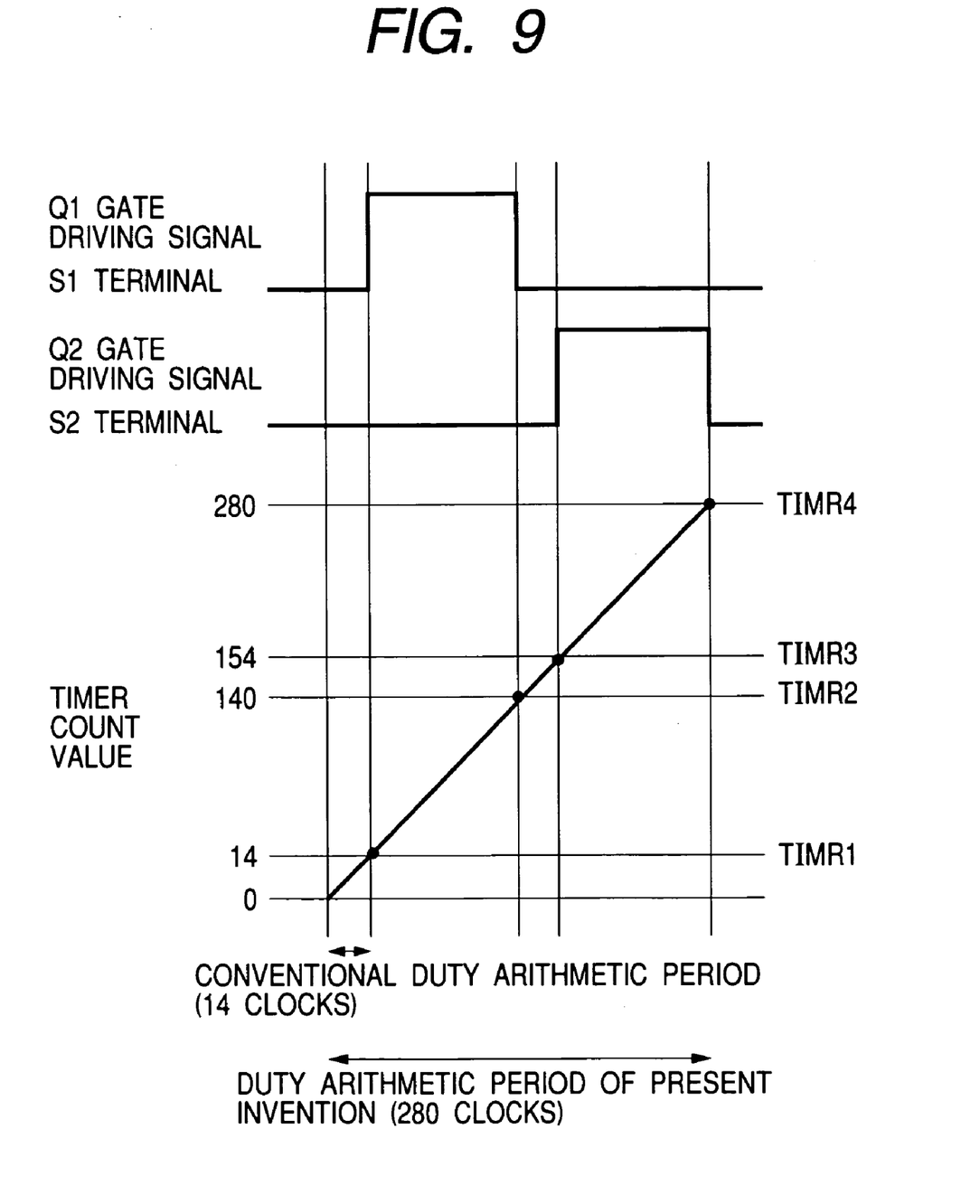
FIG. 9 is a diagram showing timer counter values, timer register values, and the outputs of the I/O terminals in the microcomputer described in Embodiment 1 of the present invention.

As shown in FIG. 9, in consideration of the maximum set duty ratio, it is necessary to calculate a duty ratio and make a setting-for a timer register within 14 clocks (500 nS) in the prior art. In contrast, the present embodiment makes it possible to calculate a duty ratio within 280 clocks (10 μS) equivalent to one switching period. Thus, it is possible to use a low-speed microcomputer for controlling the power converter, reducing the cost of the converter. Moreover, as compared with a high-speed microcomputer, the microcomputer decreases in power consumption, thereby providing a highly efficient converter.

A period for interrupt service (=the predetermined period) is equal to a switching period in the present embodiment. A plurality of interruptions may be performed in one switching period. Alternatively, one interruption may be performed for a plurality of switching periods.

Besides, in the present invention, since a current value is detected and a duty ratio is calculated beforehand in the interrupting step before the predetermined period, a signal is delayed by one switching period. On the grounds that: (1) a switching frequency is higher than 60 Hz (50 Hz) which is the frequency of output current and (2) a reactor inserted in series does not rapidly change current, even when a delay of one switching period is actually made, an output waveform is hardly affected and suppression can be sufficiently made within 3% per individual harmonic and 5% of total distortion that are the output waveform standards in a certification examination on an interconnection.

Additionally, although the present embodiment used the duty value calculated in the interrupting step before the predetermined period, the duty value is not particularly limited. Needless to say, it is possible to use an arithmetic value at an interrupt point that is so antecedent that the output wave is not affected.

Embodiment 2

Embodiment 2 of the present invention will be discussed below.

Since the internal structure and the control circuit of a power converter are the same as Embodiment 1, the following will only discuss a method of controlling a push-pull section.

(Controlling Method)

Figure 10:
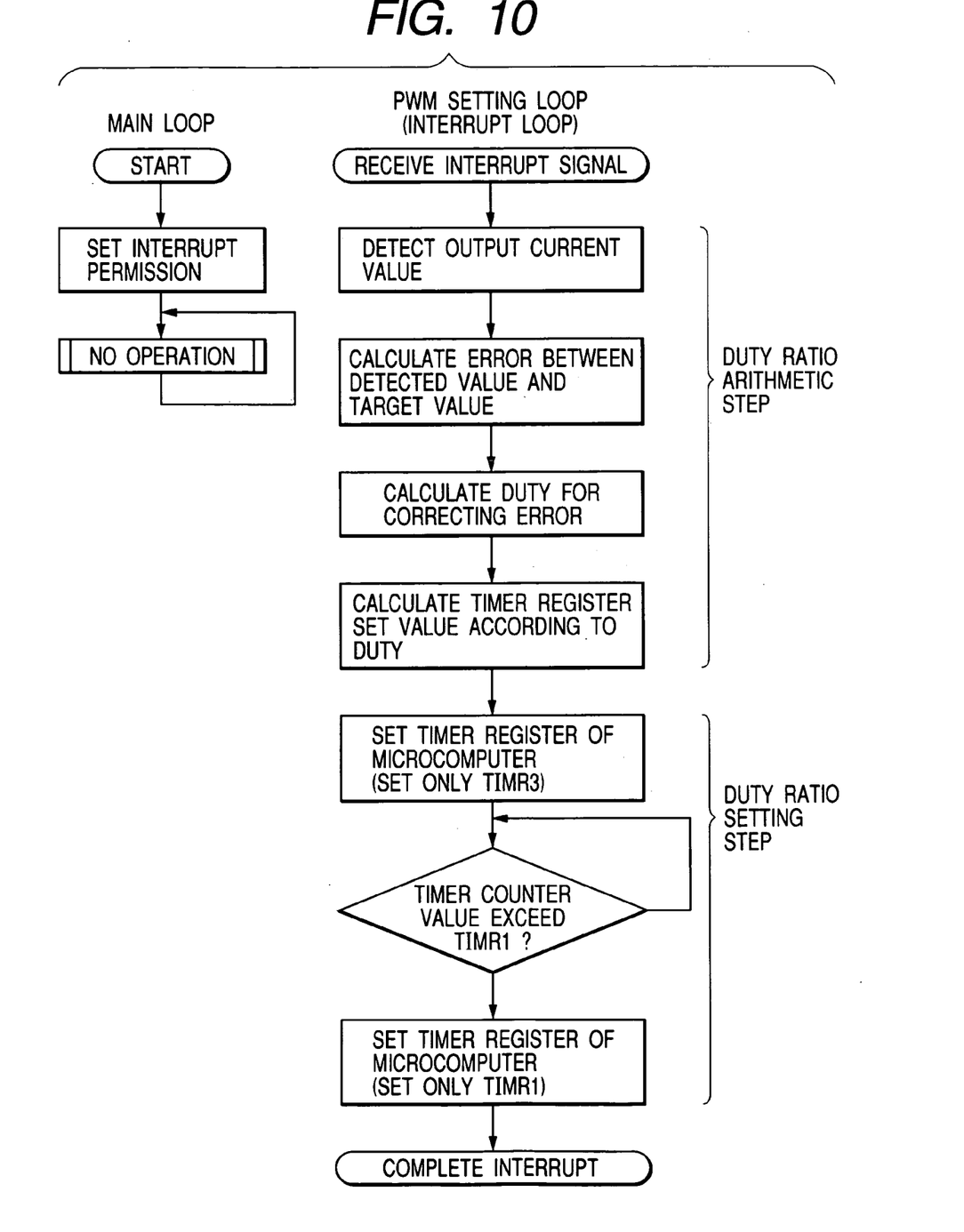
FIG. 10 is an explanatory flowchart showing a method of controlling a power converter described in Embodiment 2 of the present invention.

PWM control on the push-pull section is performed according to the flow of FIG. 10.

A loop for setting writing (PWM setting loop) on a timer register for controlling the push-pull section is started when an interrupting signal is inputted to a microcomputer. In this example, the values of TIMR2 and TIMR4 are fixed and the values of TIMR1 and TIMR3 are changed so as to generate a PWM control waveform. Then, only for the set value of TIMR1, a set value is used which is determined in an interrupting step before a predetermined period. A detailed flow will be discussed below.

First, an instantaneous current detection value is read which has been converted to digital data by an AD converter in the microcomputer, and the value is compared with an instantaneous current command value which is obtained by multiplying a reference sinusoidal waveform pattern having been recorded in a ROM beforehand by a current command value commanded by the MPPT (maximum power point tracking) of the solar cell. Then, Duty for correcting an error is calculated and a set value for the timer register is calculated according to the calculated duty.

Thereafter, the duty is set for the timer register. First, rewriting is performed on TIMR3 for setting an output from an S2 terminal that serves as a Q2 gate driving signal. Then, it is confirmed whether or not the value of a timer counter exceeds a value set in TIMR1 and a signal is outputted from an Sl terminal. When the timer counter value exceeds the value of TIMR1 after the confirmation, TIMR1 is rewritten. When the timer counter value has not exceeded the value of TIMR1 yet, standby is performed and rewriting is performed after the value of the timer counter exceeds the value of TIMR1. These operations are performed to set the value of TIMR1 at the value of the previous switching period all the time. If the value of TIMR1 is not fixed at the value of the previous switching period all the time, direct current occurs on a transformer provided in the push-pull section, resulting in biased magnetization. Hence, such control can prevent a waveform dropout from the S1 terminal. The dropout was discussed in the prior art.

The following explanation will be made with specific numeric values. When a one-chip microcomputer having an operating frequency of 28 MHz, one clock has 36 nS. Thus, when the switching frequency of the push-pull section is set at 50 kHz, one switching period has 560 clocks and thus one switching element has 280 clocks, which is equivalent to a half switching period. When the maximum set duty ratio is set at 90%, the maximum ON period of the switching element is 252 clocks. When these numeric values are actually set for the timer registers, TIMR1=28, TIMR2=280, TIMR3=308, and TIMR4=560 are obtained. At this point in time, about 220 clocks are provided from the detection of current to the calculation of a timer set value and about 10 clocks are provided for the writing of the set value in the timer register.

Figure 11:
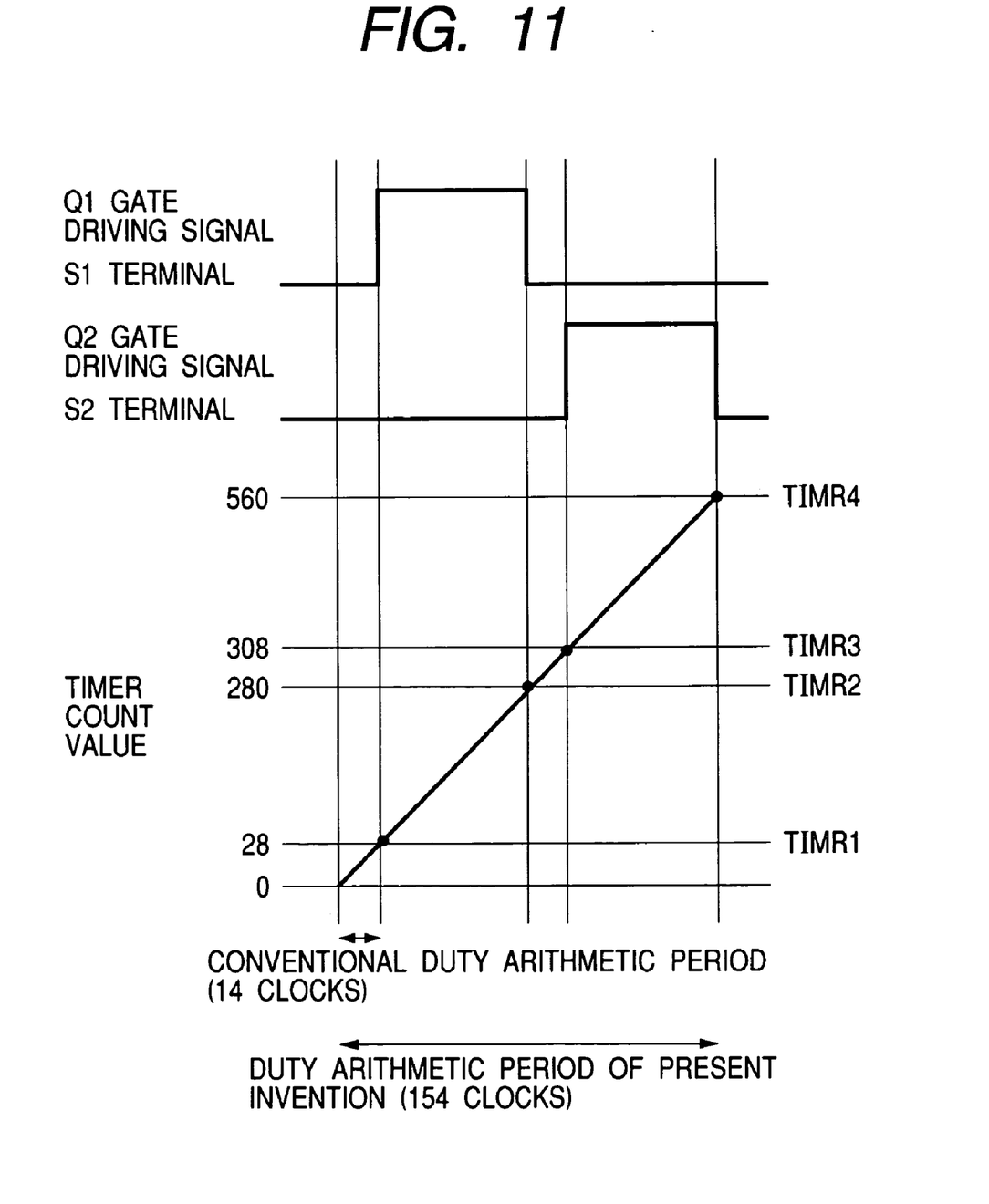
FIG. 11 is a diagram showing timer counter values, timer register values, and the outputs of I/O terminals in the microcomputer described in Embodiment 2 of the present invention.

As shown in FIG. 11, in consideration of the maximum set duty ratio, it is necessary to calculate a duty ratio and make a setting for a timer register within 28 clocks (500 nS) in the prior art. In contrast, the present embodiment makes it possible to calculate a duty ratio within 280 clocks (10 μS) equivalent to a half switching period. Thus, it is possible to use a lower-speed microcomputer for controlling the power converter, reducing the cost of the converter. Moreover, as compared with a high-speed microcomputer, the microcomputer decreases in power consumption, thereby providing a highly efficient converter.

Embodiment 3

Embodiment 3 of the present invention will be discussed below.

Since the internal structure and the control circuit of a power converter are the same as Embodiments 1 and 2, the following will only discuss a method of controlling a push-pull section.

(Controlling Method)

Embodiments 1 and 2 used PWM control for controlling a pulse width. The present embodiment will be described using FM control shown in FIG. 12, in which a frequency is controlled with a constant pulse width.

Figure 12:
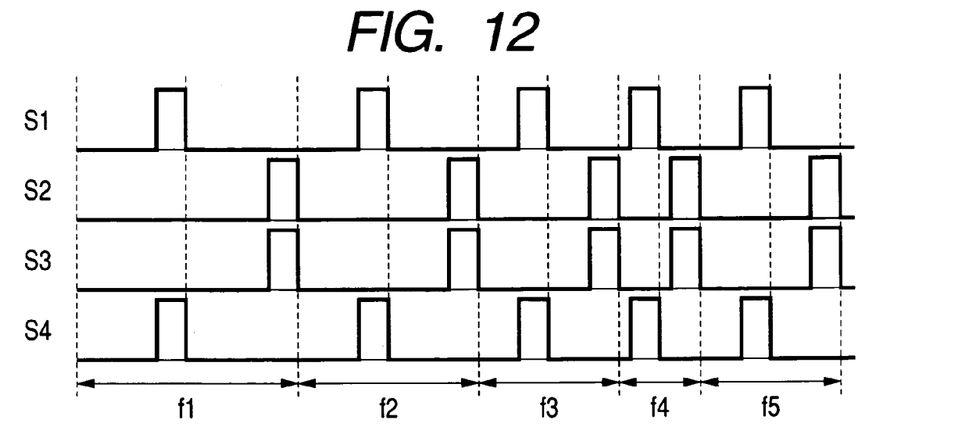
FIG. 12 is a diagram showing a switching driving signal using FM control described in Embodiment 3 of the present invention.

Since PWM control has a constant switching frequency, TIMR2 and TIMR4 of time registers have constant values all the time and only the values of TIMR1 and TIMR3 are changed, so that a pulse width is controlled. However, since a switching frequency is changed in FM control, it is necessary to rewrite all the values of the four timer registers. Thus, as compared with PWM control, time required for rewriting on the timer registers is nearly twice.

The following explanation will be made with specific numeric values. When a one-chip microcomputer having an operating frequency of 28 MHz is used, one clock has 36 nS. Thus, when the maximum switching frequency of the push-pull section is set at 50 kHz and the maximum set duty ratio is set at 90%, the minimum clocks for each switching frequency is 560 clocks, one switching element has 280 clocks equivalent to a half switching frequency, and the ON period of the switching element constantly has 252 clocks. When these numeric values are set for the timer registers, TIMR1=28, TIMR2=280, TIMR3=308 and TIMR4=560 are obtained. At this point in time, about 220 clocks are provided from the detection of current to the calculation of a timer set value and about 20 clocks are provided for the writing of the set value in the timer register.

In an actual method of controlling the push-pull section, like the control flow (FIG. 1) discussed in Embodiment 1, writing is performed first on the timer registers TIMR1 to TIMR4 for controlling the push-pull section when an interrupting signal is inputted to the microcomputer. In this case, values are written in all the registers TIMR1 to TIMR4.

Since the writing of a set value in the timer register requires 20 clocks, the value of the timer register is rewritten before reaching the minimum set timer register value (TIMR1=28). Thus, a waveform dropout in the prior art does not occur. In this way, the present invention is applicable when FM control is used as a switching method.

According to the present invention, it is possible to use a lower-speed microcomputer for controlling the power converter, reducing the cost of the converter. Moreover, as compared with a high-speed microcomputer, the microcomputer decreases in power consumption, thereby providing a highly efficient converter.

What is claimed is:

1. A method of controlling a semiconductor device using a microcomputer having a timer, the method comprising:

an interrupting step of interrupting the semiconductor device using the timer, by generating a control signal for controlling a timing of turning on/off the semiconductor device, wherein the interrupting step is performed in accordance with an interrupting signal which is input to the microcomputer at every occurrence of a predetermined period, and wherein the interrupting step comprises a setting step of giving a set value to the timer and a calculating step, which follows the setting step, of determining a set value for a subsequent interrupting step, such that the set value determined in the calculating step is given to the timer in the setting step of the subsequent interrupting step.

2. The method of controlling the semiconductor device according to claim 1, wherein the setting step of the interrupting step sets a first timing of turning on/off the semiconductor device, the first timing being calculated in the calculating step of a preceding interrupting step, and wherein the calculating step of the interrupting step calculates a second timing of turning on/off the semiconductor device, the second timing being set for the timer in the setting step of the subsequent interrupting step.

3. A method of controlling at least first and second semiconductor devices using a microcomputer having a timer, the method comprising:

an interrupting step of interrupting the at least first and second semiconductor devices using the timer, by generating a control signal for controlling a timing of turning on/off the at least first and second semiconductor devices, wherein the interrupting step is performed in accordance with an interrupting signal which is input to the microcomputer at every occurrence of a predetermined period, and wherein the interrupting step comprises a setting step of giving a set value to the timer and a calculating step, which follows the setting step, of determining a set value for a subsequent interrupting step, such that the set value determined in the calculating step is given to the timer in the setting step of the subsequent interrupting step.

4. The method of controlling the semiconductor device according to any one of claims 1 to 3, wherein the semiconductor device of a power converter is controlled.

5. The method of controlling the semiconductor device according to claim 4, wherein the power converter is a power conditioner for photovoltaic power generation.

6. A computer-executable program stored on a computer readable medium, the program for performing the method of controlling the semiconductor device according to any one of claims 1 to 3.

7. A computer-executable program stored on a computer readable medium, the program for performing the method of controlling the semiconductor device according to claim 4.

8. A computer readable medium which stores a computer-executable program for performing the method of controlling the semiconductor device according to any one of claims 1 to 3.

9. A computer readable medium which stores a computer-executable program for performing the method of controlling the semiconductor device according to claim 4.

* * * * *